(12) United States Patent
Levine

(10) Patent No.: US 6,356,084 B1
(45) Date of Patent: Mar. 12, 2002

(54) AUDIO TESTING SYSTEM

(76) Inventor: David R. Levine, 11800 Sheldon St., Unit D, Sun Valley, CA (US) 91352

(*) Notice: Subject to any disclaimer, the term of this patent is extended or adjusted under 35 U.S.C. 154(b) by 0 days.

(21) Appl. No.: 09/536,815

(22) Filed: Mar. 28, 2000

Related U.S. Application Data

(60) Provisional application No. 60/126,569, filed on Mar. 29, 1999, and provisional application No. 60/080,086, filed on Mar. 31, 1998.

(51) Int. Cl.[7] ................................................ G01R 31/02
(52) U.S. Cl. ...................................... 324/556; 324/542
(58) Field of Search .................. 324/539, 542, 324/543, 555, 556, 158.1

(56) References Cited

U.S. PATENT DOCUMENTS

| | | | |
|---|---|---|---|
| 4,227,146 A | 10/1980 | Hodge | 324/51 |
| 4,567,608 A | * 1/1986 | Watson et al. | 381/122 |
| 5,157,665 A | 10/1992 | Fakhraie-Fard et al. | 371/20.1 |
| 5,285,163 A | * 2/1994 | Liotta | 324/508 |
| 5,673,327 A | 9/1997 | Julstrom | 381/119 |
| 5,822,718 A | 10/1998 | Bakis et al. | 702/180 |

* cited by examiner

Primary Examiner—Safet Metjahic
Assistant Examiner—Paresh Patel
(74) Attorney, Agent, or Firm—Kenneth J. Hovet Law Offices; Kenneth J. Hovet; Arthur K. Samora

(57) ABSTRACT

A cable tester is provided having a receive unit comprising a cylindrical housing with open ends, a connector which is attached to one open end, and a plurality of light-emitting diodes (LED's) which are mounted within the other end and are electrically connected to the connector. The connector is attached to the end of a cable to be tested. For cables having phantom power, the phantom power energizes the connector and LED's, and the LED's illuminate in a predetermined manner according to the operating condition of the cable. Utilizing the phantom power, the tester is able to indicate whether the cable being tested is functional and, if not, what specifically is wrong with the audio cable, even when only one end of the cable is accessible. In the event the cable does not have phantom power, and provided the other end is also accessible, the tester is further provided with a send unit having a voltage source which is connected to the other end of the cable. The voltage source energizes the cable, which further energizes the connector and LED's of the receive unit.

10 Claims, 4 Drawing Sheets

AUDIO TESTING SYSTEM

This application claims priority from provisional patent application No. 60/126,569 which was filed Mar. 29, 1999, which further claims priority from provisional application No. 60/080,086 which was filed Mar. 31, 1998.

FIELD OF THE INVENTION

The present invention pertains generally to testing systems. More particularly, the present invention pertains to systems for testing audio cables. The present invention is particularly, but not exclusively, useful as a hand-held audio cable tester which uses the phantom power present in an audio cable to test the cable without requiring access to both ends of the cable.

BACKGROUND OF THE INVENTION

Recording studios, broadcast studios and public address systems all utilize audio cables to interconnect microphones and professional audio equipment. Different users of the studio/public address systems, however, have different operational requirements, which often requires a reconfiguration of the connections, or cabling, between the microphones and the audio equipment. These constant configuration changes, as well as damage from performance and normal wear-and-tear, can cause degradation in the performance of the cables. Thus, before each use, the cables should be checked to determine if the cables are working properly, or if repair and/or replacement of the cable is required. New cables should be also checked prior to any use within a cabling configuration.

Heretofore, it has been possible to test standard audio cables with standard general purpose electrical test equipment such as ohmmeters. Testing with such equipment, however, tends to be slow, laborious, and frequently erroneous. It requires multiple individual tests to confirm that all possible cable fault conditions are not present. This makes verifying a cable's suitability for usage very slow and laborious.

In order to expedite the cable testing process, several audio cable testers have been created. These testers can indicate all possible cable fault conditions at once simply by plugging both ends of an audio cable into the tester. This allows for quick and reliable testing, provided both ends of the cable are near each other and are readily accessible. Unfortunately, this is usually not the case in typical implementations of audio cabling. Often, audio cables are several hundred feet in length and are permanently or semi-permanently installed from room to room or from a stage to a control position through a conduit. Accessing both ends of the cable in order to plug them into a typical cable tester is difficult at best and often impossible.

U.S. Pat. No. 4,227,146, which issued to Hodge for a device called "Cable Tester For Locating Shorts Discontinuities And Reversals In Multi-Conductor Cables", discloses a cable tester having a constant current power supply and circuitry for connecting the ends of the cable across the power supply. Hodge further discloses a Y-shaped cable which can be attached to the tester for checking the cable when only one end thereof is accessible. The device as disclosed by Hodge, however actually increases the amount of cable to be tested, as the Y-shaped cable must also be checked for continuity.

U.S. Pat. No. 5,285,163, which issued to Liotta for an invention entitled "Electrical Cable Continuity And Voltage Tester", discloses a hand-held device for testing studio cables. For the device as disclosed by Liotta, a tester has one end formed as a plug for engaging an extension cable, and a switch activation means for illumination a plurality of indicators according to the condition of the tested cable. Liotta, however, also requires a battery for activating the device. The battery configuration increases the internal circuitry required for the device, and further makes the tester inconvenient, and even unreliable, as battery failure renders the device inoperative.

Heretofore, cable testers have not made use of a feature, phantom power, which is standard in mixing consoles and microphone preamplifiers that are used in cabling configurations. Specifically, most cabling configurations include a mixing console which supplies a current limited direct current (DC) voltage that is required for the operation of certain types of microphones. Typically, one end of the cable is plugged into the mixing console, while the other end is connected to the microphone. During operation, the mixing console applies the DC voltage through the cable to the microphone. Cables which are energized in this manner are said to have phantom power.

Most cables have three connections, or pins. When a cable is energized with phantom power, one pin (Pin 1) becomes grounded, and a DC voltage potential is established from the other two pins (Pins 2 and 3) to grounded Pin 1. Further, pins 2 and 3 are electrically isolated from each other. What is desired is a cable testing system that makes use of the DC voltage potential supplied by the phantom power to verify the operating condition of the cables. Such a tester would have a simplified construction, as the tester would not need its own power source. Further, a cable testing system that uses phantom power would allow for testing of a single end of a cable, without requiring access to the other end to complete an electrical circuit.

In light of the above, it is an object of the present invention to provide a cable testing system that tests audio cables when only one cable end is accessible by utilizing the phantom power found on typical audio mixing equipment. It is another object of the present invention to provide a cable testing system that quickly indicates the operating condition of a cable, and, if the cable is inoperative, describes specifically what is wrong with the cable. It is a further object of this invention to provide a cable testing system with a separate direct current (DC) power source to allow testing of audio cables which do not have phantom power. Yet another object of the present invention is to provide a cable testing system that tests audio cables when the ends of the cable are not in close proximity to each other. Another object of the present invention is to provide a cable testing system that is relatively easy to manufacture in a cost effective manner.

SUMMARY OF THE INVENTION

The cable tester of the present invention includes a receive unit which comprises a cylindrical housing with open ends, a receive plug that is inserted into one end of the housing and fixed thereto, and an indicating means that is mounted within the other end of the housing. The indicating means comprises a plurality of light-emitting diodes (LED's), which are electrically connected to the plug via circuitry that is internal to the housing. When the receive plug is inserted into the receptacle end of a cable with phantom power, the phantom power energizes the receive plug and the LED's, which illuminate according to the operating condition of the cable. This allows the cable to be tested when only one end of the cable is accessible.

The device of the present invention further includes a send unit which comprises a cylindrical casing having open ends, a send receptacle and a send DC voltage source. The send receptacle is inserted into one end of the casing and fixed thereto, while the send voltage source, preferably a battery, is inserted into the casing at the other end from the send receptacle and electrically connected to the receptacle. The send unit can be used when the cable to be tested does not have a phantom power source by plugging the send receptacle into the plug end of the cable. Once the send unit is plugged therein, the battery provides a DC voltage source for the cable and energizes the cable. When the receive unit discussed above is attached to the receptacle end of the cable, the receive unit also becomes energized, thereby illuminating the LED's according to the condition of the cable.

BRIEF DESCRIPTION OF THE DRAWINGS

The novel features of this invention will be best understood from the accompanying drawings, taken in conjunction with the accompanying description, in which similar characters refer to similar parts, and in which.

WRITTEN DESCRIPTION OF THE PREFERRED EMBODIMENT

Figure 1:
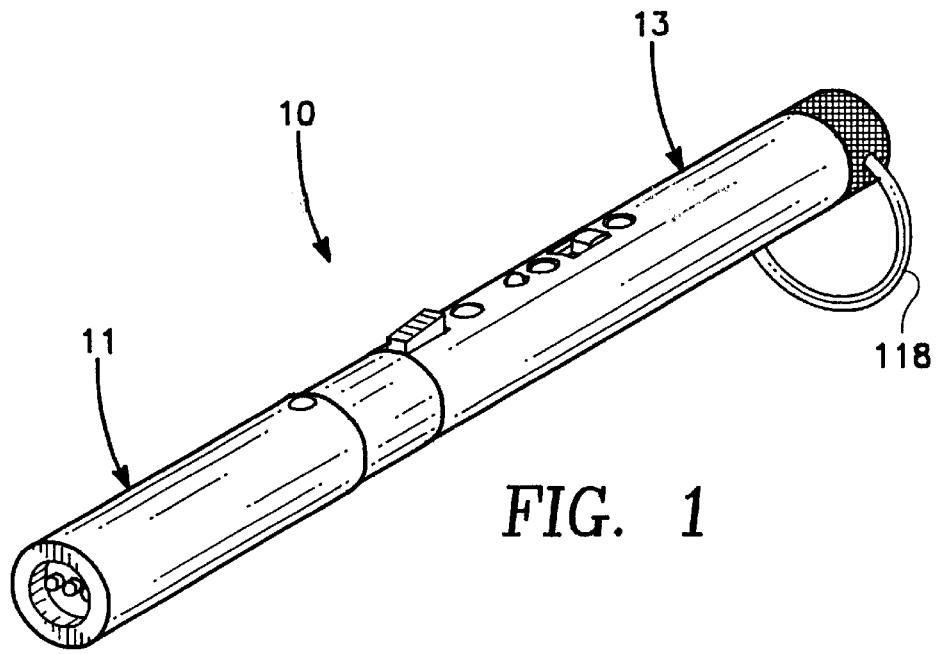
FIG. 1 is an isometric view of the cable tester of the present invention.

With reference now to the drawings, the cable tester of the present invention is shown and is generally designated by reference character 10. In brief overview, and as best seen in FIG. 1, the tester is segmented and includes a receive unit 11 and a send unit 13. Importantly, the segmented configuration for the tester facilitates the testing of cables with ends that are far apart and/or are not in one location together. The structure and cooperation of structure between the send unit, the receive unit and the ends of a cable under test is to be more fully described below.

Figure 2:
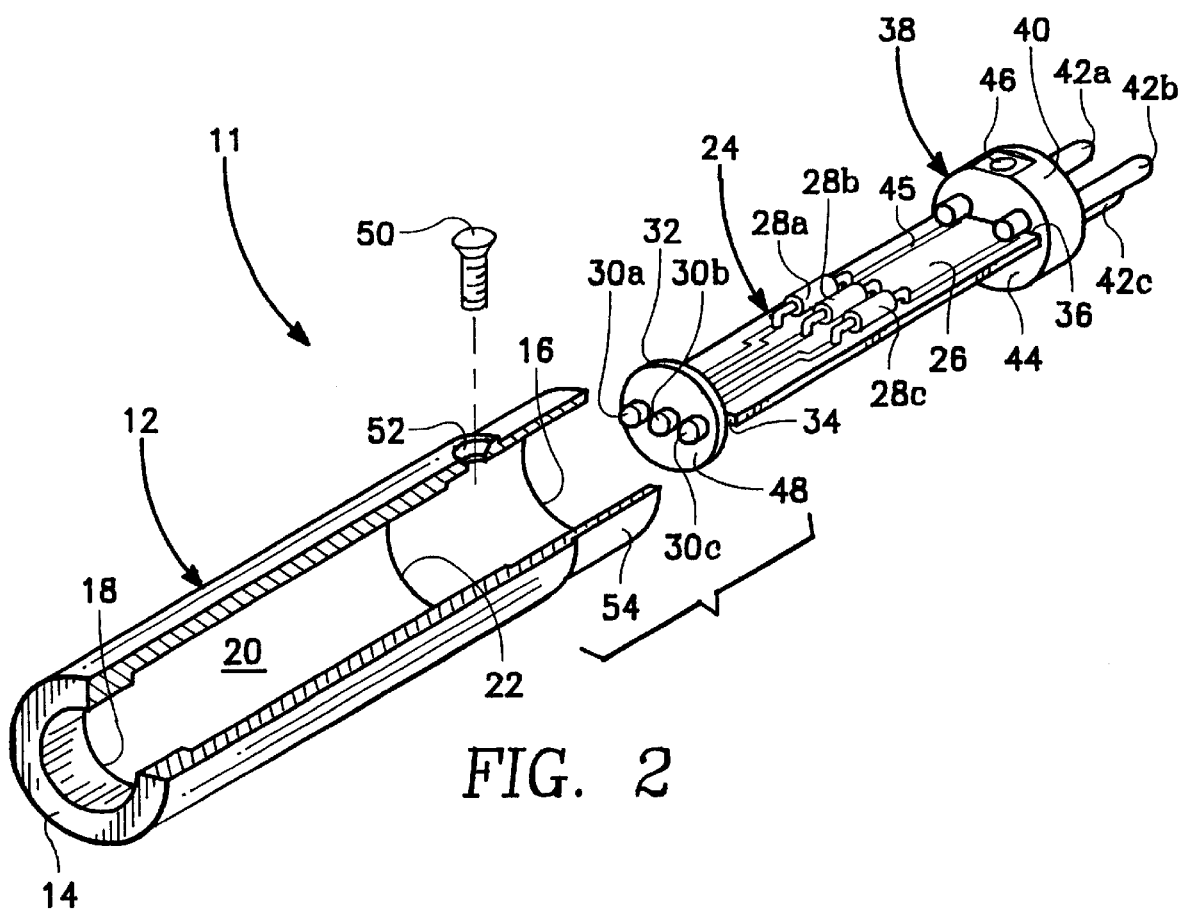
FIG. 2 is an exploded isometric view of the receive unit for the cable tester shown in FIG. 1, with portions cut away for clarity.

Referring now to FIG. 2, the receive unit 11 for the cable tester is shown in greater detail. As shown, the receive unit includes a housing 12 which has a cylindrical tube-like structure and is open at both distal end 14 and proximal end 16. The housing is formed with an internal ridge 18 in the inner surface 20 near distal end 14, and further with an internal lip 22 near proximal end 16, as best seen in FIG. 2. In the preferred embodiment, the housing is made of an anodized metal material, although other materials such as ceramics or polymer resins are feasible. Preferably, the housing is sized and shaped to be hand-held by the end user. Accordingly, oval, oblong and polygonal cross-sectional shapes for the housing could also be used as dictated by consumer choice and end user requirements.

The housing holds an electrical circuit card assembly 24 which includes a circuit board 26 and a plurality of resistors 28a, 28b, and 28c that are soldered to the circuit board in a manner well known by a skilled artisan. A plurality of light-emitting-diodes (LED's) 30a, 30b and 30c are inserted through corresponding holes (not shown) in a flat disc 32 and similarly soldered to distal end 34 of the circuit board. At the opposite proximal end 36 of the circuit board, a male receive plug 38 is fastened thereto. The receive plug includes a nonconductive base 40 and a plurality of pins 42a, 42b, 42c, with each pin extending through the inner side 44 of the plug base and being soldered to the circuit board. A maskworks 45 on the circuit board establishes an electrical circuit between the LED's, resistors and pins (The configuration of the electrical circuit is to be more fully discussed below). The base further includes a threaded tab 46 which is embedded into the side of the base, as shown in FIG. 2.

Once manufactured, circuit card assembly 24 is inserted into the housing. The disc and the plug base are both sized to closely interfit closely with the interior surface of the housing, while the circuit board is sized and shaped so that it easily fits within the housing. Accordingly, the assembly is inserted into the housing until disc outer surface 48 engages internal ridge 18. This positioning further engages inner surface 44 of the plug base against internal lip 22. Once in place, the assembly is retained in the housing with a plug fastener 50 which is threaded into the tab through plug opening 52 in the housing. With this configuration, the pins are enclosed by contoured portion 54 of the housing and do not extend past the proximal end of the housing.

Figure 3:
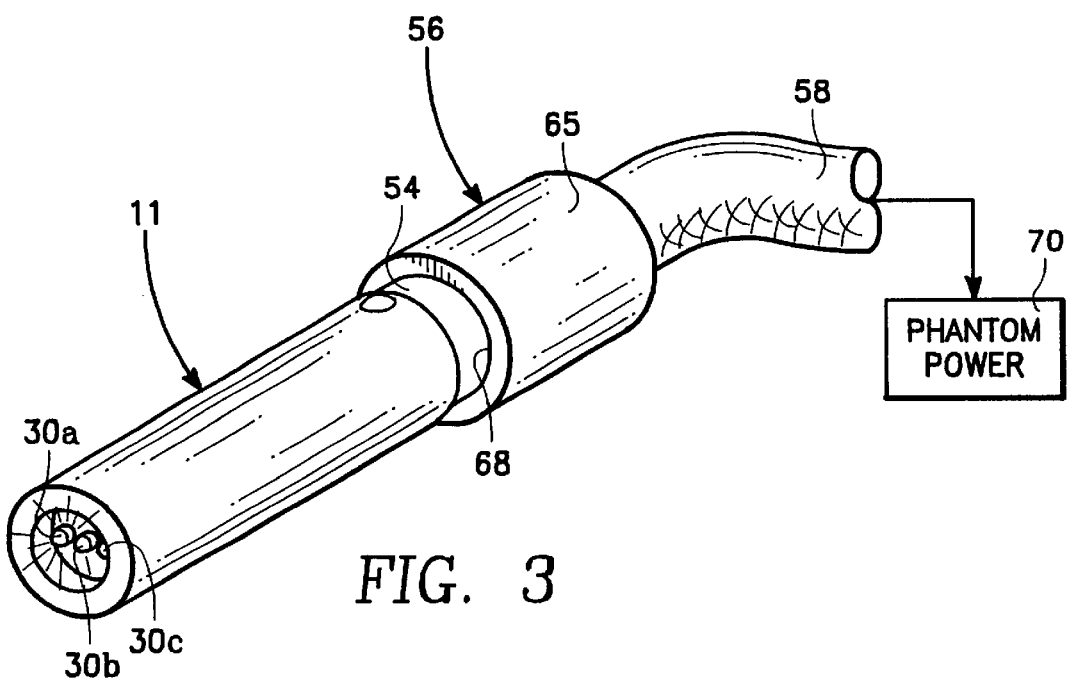
FIG. 3 is an isometric view of the receive unit of FIG. 2 and the receptacle end of a cable under test.
Figure 4:
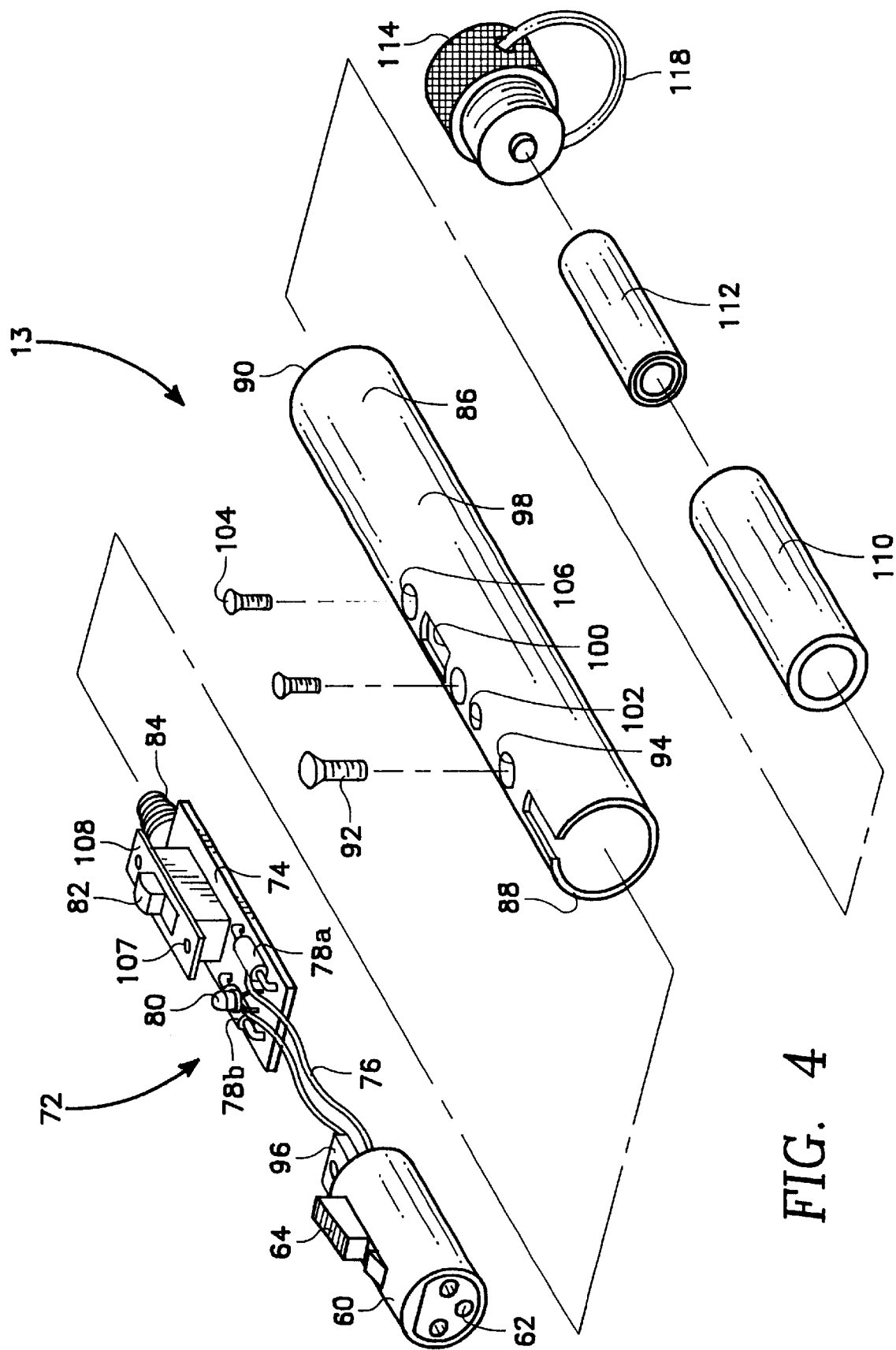
FIG. 4 is an exploded isometric view of the send unit of the tester shown in FIG. 1.

Referring now to FIGS. 3 and 4, the receive unit of the present invention is plugged into a receptacle end 56 of a standard audio cable 58. The receptacle end includes a receptacle (The receptacle for the cable end is not shown, but the structure of the receptacle is very similar to that of the send receptacle shown in FIG. 4.) which is nested within a covering 65 and fixed to the cable. Like the send receptacle in FIG. 4, the receptacle is formed with a plurality of openings 62. When the receive unit is plugged into the receptacle end, the contoured portion 54 of the housing closely interfits within the inner surface 68 of the covering, and the pins on the receive plug each engage a respective opening in the receptacle or the cable.

Within the cable 58, the receptacle is connected to a direct current (DC) voltage source (represented by block 70 in FIG. 3) which is known as phantom power in the prior art and which is typically supplied from a mixing console (not shown) in a manner well known in the prior art. The phantom power establishes a phantom DC voltage potential difference of equal magnitude between each of two ungrounded openings 62 and a third grounded opening 62. This establishes a standard industry "Shield, Live, Return (XLR)" configuration for the cable.

Referring now to FIG. 4, the send unit 13 of the present invention is shown in greater detail. As shown in FIG. 4, and mentioned above, the send unit includes a send receptacle 60 with a plurality of openings. The send receptacle includes a flexible release button 64 which is mounted to the side of the receptacle, and the send receptacle is electrically connected to one end of send circuit board 74 via wires 76. A pair of send resistors 78a, 78b and a two-color send LED 80 are also soldered to the end of the send circuit board proximate the wires. A on-off switch 82 is soldered to the circuit board at about the middle of the board, and a contact coil 84 is soldered to the opposite end of the send circuit board from the send resistors and send LED.

The send unit further includes a casing 86 which, like the housing of the receive unit, is formed in a cylindrical, tube-like structure. The casing has an open notched receptacle end 88 and an open battery end 90. For assembly, the send circuit board is inserted completely within the casing, and the send receptacle is inserted into the receptacle end of the casing. Next, the send receptacle is maneuvered until the flexible release button of the send receptacle interfits with the notch in the receptacle end. Once in place, a receptacle fastener 92 is inserted through a receptacle opening 94 in the casing proximate the notch and threaded into receptacle tab 96 to fix the receptacle to the send unit casing.

At a middle portion 98 of the casing, a longitudinal slot 100 is cut into the casing, and switch 82 of send circuit board 72 interfits with the casing slot. Similarly, an LED hole 102 is bored into the casing, and send LED 80 interfits therewith. To fix the send circuit board to the casing, a pair of switch fasteners 104 are inserted through respective switch holes 106 proximate casing slot 102 and threaded into plate openings 107 in switch plate 108. This fixes the send circuit board to the casing.

At the battery end 90 of the casing, a tube-like insulation insert 110 is inserted into the casing. Next, a direct current (DC), battery 112, preferably twelve volts, is pushed up into the insulation insert until the battery terminal touches contact coil 84. Finally, a retaining cap is threaded into internal threads (not shown) in the casing to hold the battery in place. Selective activation of the switch by placing the switch in the "on" position establishes an electrical connection, in sequence, from the battery, to the send LED and then to the send resistors for further establishing an electrical circuit as described below.

Figure 5:
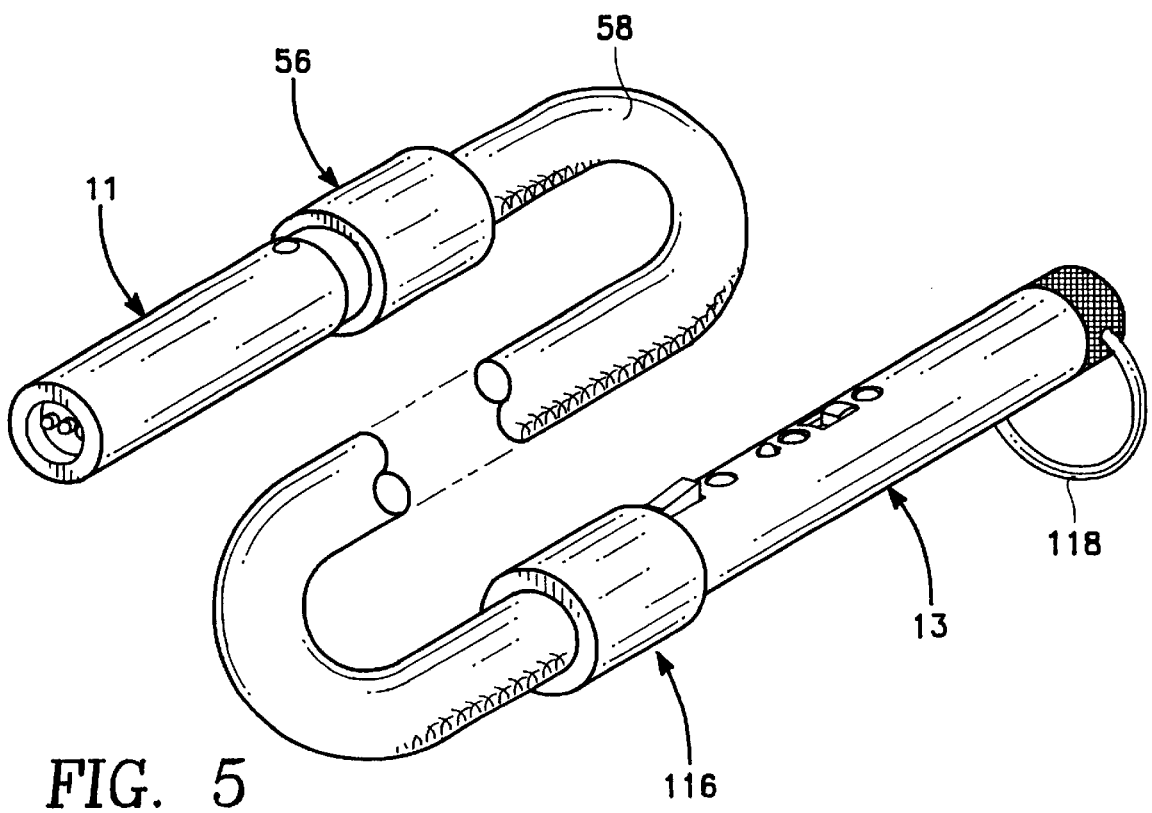
FIG. 5 is an isometric view which shows the receive unit of FIG. 1 and the send unit of FIG. 4 connected to a cable under test.

Referring now to FIG. 5, the send unit is shown connected to plug end 116 of audio cable 58. The plug end comprises a male plug (not shown in FIG. 4, see FIG. 1) which is nested within covering 65. The manner in which the plug end of the cable engages the send receptacle of the send unit is similar to the manner in which the receptacle end of the cable engages the receive plug of the receive unit, as described above. This is further illustrated in FIG. 1, where the receive plug of the receive unit interfits with the send receptacle of the send unit. It is to be appreciated, however, that the tester is not operated by connecting the send unit to the receive unit, but merely that the plugs and receptacles of the send unit, the receive unit and the cable are designed to be interchangeable. In fact, the send unit is plugged into the receive unit as shown in FIG. 1 merely for easy and convenient storage of the tester. For this purpose, a ringlet 118 is attached to the tester, as shown in FIG. 1, for handy attachment of the tester to the belt loop (not shown) of an end user.

Figure 6:
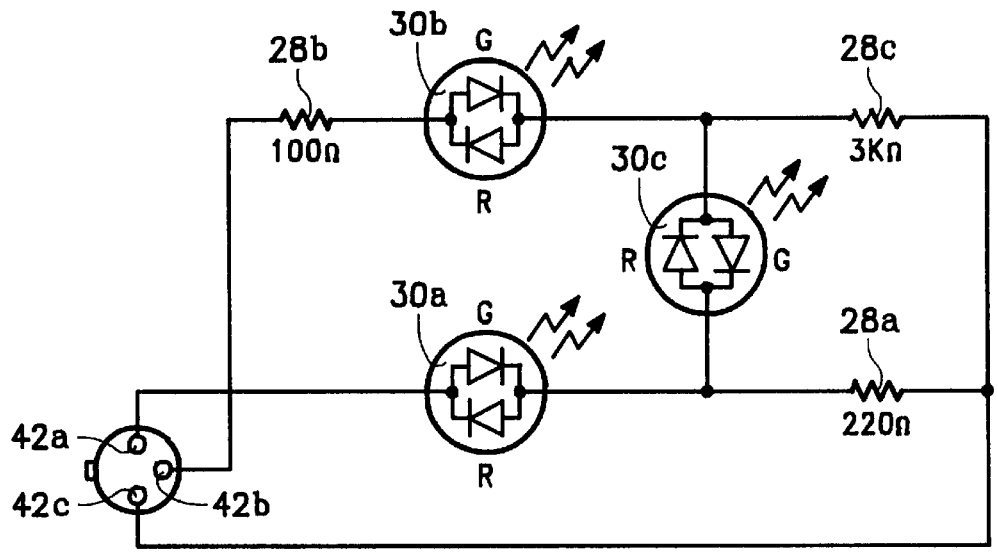
FIG. 6 is an electrical schematic diagram of the receive unit shown in FIG. 2.

Referring now to FIG. 6, the electrical circuitry for the circuit card assembly is described in greater detail. From pin 42a, LED 30a is electrically connected in series with resistor 28a, and resistor 28a is connected to pin 42c (ground). This establishes an electrical circuit from, in sequence, pin 42a, LED 30a, resistor 28a to pin 42c when a voltage potential is applied across pins 42a and 42c.

As further shown in FIG. 6, resistor 28b is wired in series with pin 42b, and LED 30b is wired in series with resistor 28b. A series combination is defined by the wiring in series of resistor 28a and LED 30c. The defined series combination is wired in parallel with resistor 28c to establish a parallel combination. The parallel combination is wired in series with LED 30b. This establishes an electrical circuit, in sequence, from pin 42b to resistor 28b, LED 30b, the parallel combination and to grounded pin 42c when a voltage is applied across pins 42b and 42c as described below.

Resistor 28c must have a resistive value that is an order of magnitude greater than that of resistor 28a, and resistor 28b preferably has sufficient resistance to prevent the LED's from illuminating too brightly. In the preferred embodiment, resistors 28a, 28b and 28c are two hundred twenty Ohm (220Ω), one hundred Ohm (100Ω) and three thousand Ohm (3KΩ) resistors, respectively. The LED's are preferably two-color, red-green LED's.

Figure 7:
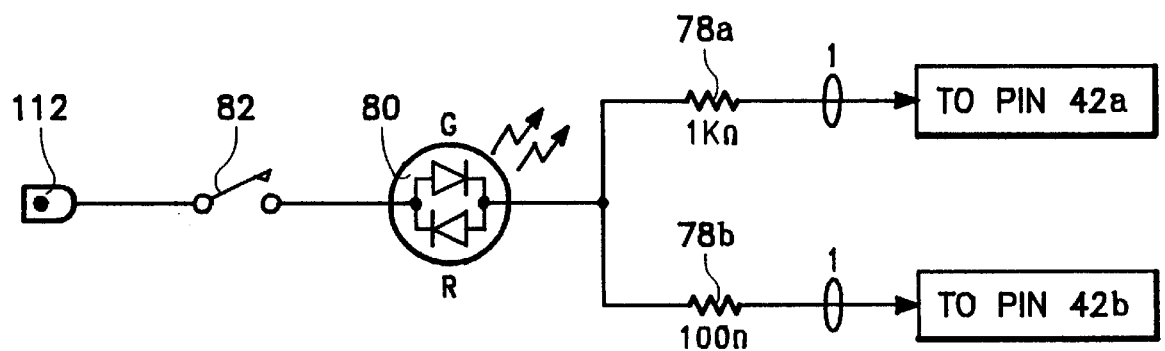
FIG. 7 is an electrical schematic diagram of the send unit shown in FIG. 4.

FIG. 7 shows the electrical configuration of the send unit. Specifically, switch 82 is wired in series With battery 112, and two-color send LED 80 is wired in series with the switch. From send LED 80, send resistors 78a and 78b are wired in parallel. Resistor 78a must have a resistive value that is an order of magnitude greater than that of resistor 78b. Preferably, resistor 78a has a resistance of one thousand Ohms (1KΩ), while resistor 78b is a one hundred Ohm (100Ω) resistor. Send LED 80 is preferably a two-color, red-green LED.

Operation

For the operation of the receive unit, the receive unit is plugged into the receptacle end of a standard XLR audio cable as described above (see FIG. 3). When the receive unit is plugged therein, each pin on the plug further interfits into a corresponding opening of the receptacle, thereby establishing electrical contact. Since the openings for the cable receptacle are connected to phantom power as described above, the pins also become electrically connected to the phantom power and become energized. This further establishes a voltage potential difference from pin 42a to pin 42c, as well as from pin 42b to pin 42c. Stated differently, plugging the receive unit into the receptacle end of an XLR audio cable establishes an electrical circuit and causes current flow from pin 42a to 42c, as well as from pin 42b to pin 42c.

Provided the cable under test is properly functioning, current flows from pin 42a through LED 30a, thereby illuminating LED 30a in a green color, through resistor 28a and then to ground pin 42c. With respect to pin 42b, current flows from pin 42b to resistor 28b and then through LED 30b, illuminating LED 30b in a green color. From LED 30b, the current encounters two different paths to the ground pin 42c. Resistor 28c (3KΩ) provides a resistive path to ground that is an order of magnitude greater than a path through LED 30c and resistor 28a (220Ω). Accordingly, the current takes the path of lesser resistance and further illuminates LED 30c, again, providing no fault condition exists in the cable. The end user observes three green illuminated LED's at the distal end of the receiving unit and, thus, knows that the cable is wired properly and that no fault condition exists in the cable.

If the cable does not have a phantom power source, the send unit is plugged into the male connector 116 of the cable (see FIG. 5). Once the send unit is plugged therein, send resistor 78a becomes electrically connected (through the cable) to pin 42a, while resistor 78b becomes electrically connected to pin 42b. When switch 82 is closed (placed in the "on" position), battery 112 provides a voltage potential across pins 42a and 42c, as well as pins 42b and 42c, and energizes the receive unit circuitry as described above. It is to be appreciated that switch 82 is not necessary for the operation of the send unit, in the sense that the send unit would operate if the switch was removed from the circuit. Switch 82 is included in the send unit primarily to electrically isolate the battery when the send unit is plugged into the receive unit for storage (see FIG. 1). This prevents battery 112 from unnecessarily draining and minimizes wear and tear to the LED's.

As described above, LED's 30*a*, 30*b* and 30*c* all indicate green when the cable is wired correctly. Table 1 below lists the LED indications according to various fault conditions of the cable.

TABLE 1

| FAULT CONDITION | LED 30a | LED 30b | LED 30c |
|---|---|---|---|
| Pin 42c open | Off | Off | Off |
| Pin 42a open | Off | Green | Green |
| Pin 42b open | Green | Off | Off |
| Short, pins 42a–42b | Green Bright | Green Dim | Off |
| Short, pins 42a–42c | Off | Green | Green |
| Short, pin 42b–42c | Green | Off | Off |
| Swap, pins 42a–42c | Red Bright | Green | Green |
| Swap, pins 42b–42c | Green Dim | Red | Red |
| Swap, pins 42a–42b | Green | Green Dim | Off |

There are two fault conditions which are particularly worthy of note. The first is the fault in which pins 42*a* and 42*b* are shorted. For a normal cable condition, pins 42*a* and 42*b* are electrically isolated from each other. When pins 42*a* and 42*b* are isolated, and keeping in mind that the DC voltage is current limited, a small voltage potential exists across LED 30*c*. The voltage potential across LED 30*c* allows for current flow therethrough, thereby illuminating LED 30*c* for a cable that is operating correctly.

When a short between pins 42*a*–42*b* exists, there is insufficient current across LED 30*c* to illuminate it. This is because most of the current takes the path of least resistance and flows from pin 42*a* through LED 30*a* and resistor 28*a*. The remaining current flows from pin 42*b* through resistor 28*b* and then LED 30*b*, and is sufficient for illuminating LED 30*b* (albeit dimly). After illuminating LED 30*b*, however, the remaining current is further split between a path through resistor 28*c* to ground, and between a path from LED 30*c*, through resistor 28*a* and then to ground, and enough current flows through resistor 28*c* so that there is insufficient current flowing through flowing LED 30*c* for illumination thereof. Thus, for a short from pin 42*a* to 42*b*, LED's 30*a*, 30*b* and 30*c* will illuminate as listed in Table 1. The above-described ability to detect a short between two ungrounded pins in an audio cable is one of the basic operative aspects of the tester of the present invention and is a major improvement over the prior art.

The last fault condition listed in Table 1 above, the fault in which pins 42*a* and 42*b* are swapped with respect to each other, is also worthy of note. This is because the send unit is required to detect this particular fault condition. When the send unit is plugged into the receptacle end of the cable, send resistor 78*a* (1KΩ) effectively becomes wired in series with pin 42*a*, and send resistor 78*b* (100Ω) becomes wired in series with pin 42*b*. If the fault condition exists whereby pins 42*a* and 42*b* are swapped, resistor 78*a* (1KΩ) becomes wired in series with resistor (100Ω). When this happens, a large portion of the voltage drop occurs across send resistor 78*a*. In accordance with known electrical principles, since there is a large voltage drop across resistor 78*a*, there is a small current flow through resistor 78*a* (for a current limited circuit). Accordingly, there is relatively little current flow across LED 30*b*, and LED 30*b* illuminates very dimly, as indicated in Table 1 above. This uses up most of the remaining current, and insufficient current remains to cause a voltage drop across LED 30*c*. Thus, LED 30*c* does not illuminate. The ability of the send unit, in conjunction with the receive unit, to detect a swap between the two pins of an audio cable which are not grounded is another major improvement of the present invention over the prior art.

While the particular cable tester, as herein shown and disclosed in detail, is fully capable of obtaining the objects and providing the advantages above stated, it is to be understood that the presently preferred embodiments are merely illustrative of the invention. As such, no limitations are intended other than as defined in the appended claims.

What is claimed is:

1. A segmented cable tester for determining an operating condition of a cable having a direct current (DC) phantom power source, said cable further having a plug end at a first location and a receptacle end at a second location remote from said first location, said tester comprising:

a receive unit segment having a receive plug with a first ungrounded pin, a second ungrounded pin and a third grounded pin;

a first LED, a second LED and a third LED;

a first resistor wired in series with said first LED to establish a series circuit from said first ungrounded pin through said first LED, said first resistor, to said third grounded pin;

a second resistor and a third resistor, said third resistor being wired in parallel with a series combination defined by said third LED being wired in series with said first resistor, said third resistor and said series combination defining a parallel combination, said parallel combination being wired in series with said second LED and said second resistor, to establish an electrical circuit from, in sequence, said second ungrounded pin to said second resistor, said second LED, said parallel combination to said third grounded pin;

said first LED, said second LED and said third LED being energized by said phantom power source when said receive plug is connected to said receptacle end for immediately providing a predetermined indication according to said operating condition of said cable when said receive plug is connected to said receptacle end; and, a send unit segment electrically isolated and mechanically detached from said receive unit segment, said send unit segment having a send receptacle and a direct current (DC) voltage source electrically connected to said send receptacle for selectively applying a current-limited DC voltage to said cable when said send receptacle is connected to said plug end.

2. The tester of claim 1 wherein said send receptacle is disconnected from said plug end, and further wherein said receptacle end comprises a cable receptacle having at least one ungrounded opening and having a grounded opening, and further wherein said first and second ungrounded pins correspond to a respective ungrounded opening and said grounded pin corresponds to said grounded opening in said cable receptacle.

3. The tester of claim 2 wherein said phantom power source establishes a phantom voltage potential from said first ungrounded pin to said grounded pin, and from said second ungrounded pin to said third grounded pin, and from said first ungrounded pin to said second ungrounded pin, when said receive plug is connected to said receptacle end.

4. The tester of claim 2 wherein said cable phantom power establishes a phantom direct current (DC) voltage potential between each ungrounded opening and said grounded opening, said phantom DC voltage potential energizing said indicating means when said receive plug is connected to said cable receptacle.

5. A device for determining an operating condition of a cable having a direct current (DC) phantom power source and having at least one free end, said device which comprises:

a housing formed with an open first end and an open second end, a connector inserted into said first end and fixed to said housing and further having a first ungrounded pin, a second ungrounded pin and a third grounded pin;

a first light-emitting diode (LED), a second LED and a third LED;

a first resistor wired in series with said first LED to establish a series circuit from said first ungrounded pin through said first LED, said first resistor, to said third grounded pin;

a second resistor and a third resistor, said third resistor being wired in parallel with a series combination defined by said third LED being wired in series with said first resistor, said third resistor and said series combination defining a parallel combination, said parallel combination being wired in series with said second LED and said second resistor, to establish an electrical circuit from, in sequence, said second ungrounded pin to said second resistor, said second LED, said parallel combination to said third grounded pin; and, said first LED, said second LED and said third LED being energized by said phantom power source for immediately providing a predetermined indication according to said operating condition of said cable when said connector is plugged into said free end.

6. The device of claim 5 wherein said free end comprises a cable receptacle having two ungrounded openings and a grounded opening to establish a Shield, Live, Return (XLR) configuration for said cable, and further wherein said ungrounded pins correspond to a respective ungrounded opening and said grounded pin corresponds to said grounded opening.

7. The device of claim 6 wherein said cable phantom power establishes an internal phantom direct current (DC) voltage potential between each ungrounded opening and said grounded opening, and between the two ungrounded openings, when said receive plug is connected to said cable receptacle.

8. The device of claim 7 wherein said phantom DC voltage potential is established from said first ungrounded pin to said third grounded pin and from said second ungrounded pin to said third grounded pin, and from said first ungrounded pin to said second ungrounded pin when said receive plug is connected to said cable receptacle.

9. The device of claim 8 wherein said cable has a first end comprising said cable receptacle and a second end including a cable plug, and further comprising:

a casing mechanically isolated from said housing and having an open receptacle end and an open battery end;

a send receptacle electrically isolated from said receive plug, positioned in said receptacle end and mounted to said casing; and, a current-limited send DC voltage source for emulating said phantom power source and being positioned in said battery end and fixed to said casing, said send DC voltage source being electrically connected to said send receptacle for energizing said indicating means, and further for establishing a send DC voltage potential from said first ungrounded pin to said third grounded pin and from said second ungrounded pin to said third grounded pin, and from said first ungrounded pin to said second ungrounded pin when said send receptacle is connected to said cable plug.

10. A method for determining the operating condition for a cable having a phantom direct current (DC) power source, said phantom power source energizing a plug end at a first location and a receptacle end at a second location remote from said first location, said plug end having a first ungrounded pin, a second ungrounded pin and a third grounded pin, said method comprising the steps of:

providing a receive unit, said receive unit including a cylindrical housing formed with an open first end and an open second end, a receive plug inserted into said first end and fixed to said housing and a plurality of LEDs inserted into said second end and fixed to said housing, said LEDs being electrically connected to said receive plug;

connecting said receive plug to said to said receptacle end of said cable to thereby energize said LEDs with said phantom power source;

providing a send unit for determining a voltage potential difference between said first ungrounded pin and said second ungrounded pin, said send unit having a casing with an open first end and an open second end, said casing including a send receptacle positioned in said first end and fixed to said casing and a send DC current voltage source positioned in said second end and fixed to said casing, said send DC voltage source being electrically connected to said send receptacle for energizing said indicating means when said send receptacle is connected to said plug end of said cable;

connecting said send unit to said plug end of said cable; and, immediately observing said LEDs, said LEDs illuminating in a predetermined manner according to said operating condition of said cable.

* * * * *